(12) United States Patent
Albert et al.

(10) Patent No.: US 6,804,694 B2
(45) Date of Patent: Oct. 12, 2004

(54) ADAPTIVE EQUALIZER WITH GAIN CONTROLLED INITIALIZATION

(75) Inventors: Jose Luis Albert, Madrid (ES); Rogelio Peon, Gijon (ES); Pablo Vila, Madrid (ES)

(73) Assignee: Agere Systems, Inc., Allentown, PA (US)

(*) Notice: Subject to any disclaimer, the term of this patent is extended or adjusted under 35 U.S.C. 154(b) by 560 days.

(21) Appl. No.: 09/885,781

(22) Filed: Jun. 20, 2001

(65) Prior Publication Data

US 2003/0028570 A1 Feb. 6, 2003

(51) Int. Cl.$^7$ ............................................. G06F 17/10
(52) U.S. Cl. ...................................... 708/305; 375/231
(58) Field of Search ................................ 708/305, 323; 375/231, 232

(56) References Cited

U.S. PATENT DOCUMENTS

| | | | | |
|---|---|---|---|---|
| 3,659,229 A | * | 4/1972 | Milton | 333/18 |
| 5,267,266 A | * | 11/1993 | Chen | 375/232 |
| 5,537,437 A | * | 7/1996 | Kaku et al. | 375/231 |
| 6,674,795 B1 | * | 1/2004 | Liu et al. | 375/231 |

* cited by examiner

Primary Examiner—David H. Malzahn
(74) Attorney, Agent, or Firm—Duane Morris LLP

(57) ABSTRACT

Initialization of an adaptive equalizer is controlled by varying a gain applied to an input signal. The input signal may be an alternate mark inversion signal. The gain is applied to the input signal to form an amplified signal. An autocorrelation value of the amplified signal is calculated. The autocorrelation value is compared to a predetermined constant. The gain is adjusted, based on which of the group consisting of the autocorrelation value and the predetermined constant is greater. The gain application, autocorrelation calculation, comparison and gain adjustment are repeated, until the autocorrelation value is sufficiently close to the predetermined constant to satisfy a convergence criterion. The amplified signal is then filtered.

24 Claims, 2 Drawing Sheets

100

106

ADAPTIVE EQUALIZER WITH GAIN CONTROLLED INITIALIZATION

FIELD OF THE INVENTION

The present invention relates to signal processing generally, and more specifically to adaptive equalization devices.

BACKGROUND OF THE INVENTION

AMI (Alternate Mark Inversion) transmission line code is extensively used for signal transmission over metallic interfaces, such us T1/E1 or SONET/SDH. The characteristics and length of the cable used as transmission channel may be unknown, so blind adaptive equalization techniques plays a very important role in order to restore the original transmitted signal at the receiver. However, most adaptive equalization techniques fail to equalize AMI signals given the source correlation (memory effect) of this transmission code.

The Decision-Directed Least Mean Squares algorithm (DD-LMS) has shown effectiveness when equalizing AMI signals despite the source correlation, but this technique may be affected by convergence problems if the equalizer coefficients are not initialized properly. The adaptation of the filter coefficients can easily lead to a solution where all the filter coefficients grow to an infinite value or are reduced to zero. In both cases the transmitted signal is not recovered.

An equalizer for AMI signals has been implemented, in which the DD-LMS algorithm is used to equalize the AMI signal. In order to avoid wrong convergence, an analog automatic gain controlled amplifier based on the input signal envelope and a set of fixed IIR (Infinite Impulse Response) filters were provided.

The filter that showed the least error, depending on a certain criterion, was chosen to pre-equalize the signal. The pre-equalization performed by the fixed IIR filter reduces the risk of wrong convergence. However, due to the absence of accurate control of the equalizer initialization, convergence to the zero solution (all coefficients equal to zero) can be easily achieved for long cables. A wide range of cable types and lengths, are appropriate for T1/E1 applications, but correct performance (i.e., avoiding the zero solution) on different conditions cannot be assured.

An improved method and apparatus for ensuring correct convergence of an adaptive equalizer is desired.

SUMMARY OF THE INVENTION

The present invention is a method and apparatus for processing an input signal. A gain is applied to an input signal to form an amplified signal. An autocorrelation value of the amplified signal is calculated. The autocorrelation value is compared to a predetermined constant. The gain is adjusted, based on which of the group consisting of the autocorrelation value and the predetermined constant is greater. The gain application, autocorrelation calculation, comparison and gain adjustment are repeated, until the autocorrelation value is sufficiently close to the predetermined constant to satisfy a convergence criterion. The amplified signal is then filtered.

OVERVIEW

The present invention includes an equalizer 100 and a method of initializing the coefficients $w_k$ of equalizer 100 so that the DD-LMS algorithm is able to equalize an AMI signal s(t) converging to a solution different from zero (all coefficients equal to zero), and avoiding instability problems (coefficients growing to an infinite value).

Figure 1:
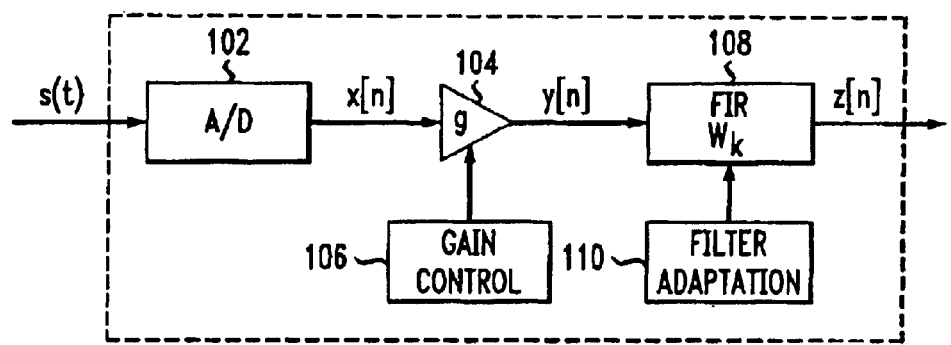
FIG. 1 is a block diagram of an exemplary equalizer according to the present invention.

FIG. 1 is a block diagram of an equalizer 100 according to the invention. The exemplary equalizer 100 includes a programmable gain amplifier 104 having a gain "g" that is accurately initialized to adapt the amplitude of the input signal x[n], so that convergence to the zero ("trivial") solution is avoided without creating instability problems. The appropriate initialization is based on the auto correlation of the equalizer input signal y[n]. Once the gain "g" has been set, the DD-LMS equalizer 100 can start the adaptation process.

ANSI recommendation T1.403-1995 describes the AMI transmission line code. This code makes use of one symbol to transmit one single bit. Three different symbols are defined for AMI sources: positive pulses, negative pulses and absence of pulse. By definition, the pulses' polarity must alternate between consecutive pulses. Thus, there is always a negative pulse between two positive pulses and vice versa. The three possible AMI symbols can be summarized by the alphabet S:

$$S=\{A, 0, -A\}$$

where A is the amplitude of the transmitted pulses.

FIG. 1 shows the structure of adaptive digital equalizer 100. The received signal s(t) is converted to a digital signal x[n]=s(nT) in an analog-to-digital converter (ADC) 102, where T is the sampling period, equal to the symbol rate (baud spaced equalization). A programmable gain amplifier 104 with a gain "g" amplifies the signal x[n] before it is equalized by a Finite Impulse Response (FIR) filter 108, the coefficients $w_k$ of which are updated by filter adaptation block 110, using a certain adaptive technique (for k from 0 to L−1, L being the equalizer length), according to the following equation (1):

$$z_n = \sum_{k=0}^{L-1} y[n-k] \cdot w_k = g \cdot \sum_{k=0}^{L-1} x[n-k] \cdot w_k = g \cdot \sum_{k=0}^{L-1} S((n-k)T) \cdot w_k$$

The filter adaptation block 110 uses the Decision-Directed Least Mean Squares (DD-LMS) algorithm. The DD-LMS algorithm has shown effectiveness when equalizing AMI signals. For this kind of signal, the adaptation algorithm implemented in block 110 is specified in equations (2) and (3):

$$w_k[n+1] = w_k[n] - \mu \cdot (z[n] - \theta(z[n])) \qquad (2)$$

$$\theta(z[n]) = \begin{cases} -A & \text{for } z[n] < -\frac{A}{2} \\ 0 & \text{for } -\frac{A}{2} < z[n] < \frac{A}{2} \\ A & \text{for } z[n] > \frac{A}{2} \end{cases} \qquad (3)$$

In the adaptive formula, $w_k[n]$ is the value of coefficient $w_k$ at iteration n, A is the amplitude of the transmitted pulses, and $\mu$ is a step size that controls the convergence speed of the DD-LMS algorithm. All filter coefficients are initialized to zero except for the central coefficient, which is initialized to one.

If the gain "g" of programmable amplifier 104 is too small, all the filter coefficients $w_k$ converge to zero, and if the gain g is too high, all coefficients grow up to an infinite value. The gain initialization is based on some stochastic properties of AMI signals.

Let N be the maximum expected length (number of filter taps) for the discrete version of the impulse response of the channel over which the signal s(t) is transmitted, that is, the total channel impulse response length divided by the sampling period T. Parameter K is defined as follows:

$$K = -\frac{4}{S^2} \cdot \sum_{m=1}^{N} m \cdot \phi_y[m] \quad (4)$$

where $\phi_y[m]$ is the autocorrelation function of signal y[n].

$$\phi_y[m] = E(y[n]y[n+m]) \quad (5)$$

where E( ) indicates the expected value.

In order to avoid convergence of the DD-LMS algorithm to the zero solution (where all filter coefficients converge to zero), K must meet the next condition:

$$K > \frac{\sqrt{N}}{2} \quad (6)$$

In order to allow convergence, parameter K must meet the next requirement:

$$K < \frac{\mu A^2 \sqrt{N}}{\mu A^2 N - 2} \quad (7)$$

where $\mu$ is the step size used by the DD-LMS adaptive algorithm of equation (2) (in filter adaptation block 110), and N is the correlator length, equal to the channel impulse response maximum expected length.

As K is proportional to $g^2$, and g is the gain of programmable amplifier 104, the programmable amplifier gain is increased or decreased in order to meet both requirements. Instead of using a set of fixed IIR filters with a selection algorithm, the correct performance of the DD-LMS technique applied to AMI signals equalization is reached by means of proper gain g initialization using gain control 106.

DETAILED DESCRIPTION

Figure 2:
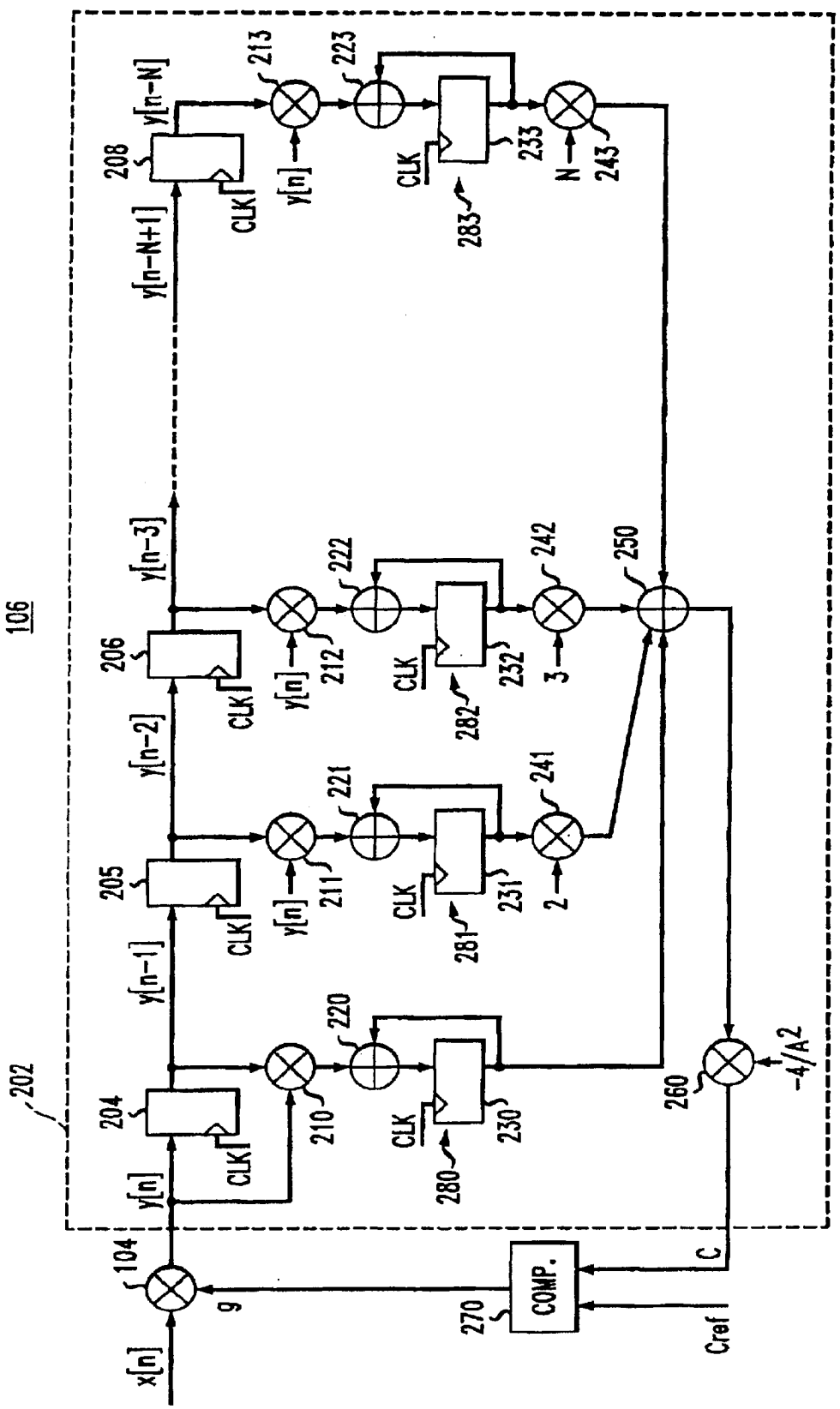
FIG. 2 is a block diagram of the exemplary gain control, amplifier, filter and filter adaptation blocks of FIG. 1.

FIG. 2 shows an exemplary embodiment of gain control apparatus 106 for the equalizer 100 shown in FIG. 1. The amplifier 104 is shown, with gain "g". In addition, the gain control apparatus 106 includes a correlator 202 whose output "C" is provided to a "comparator circuit" 270. The comparator 270 adjusts the gain "g" based on the ideal value "Cref".

The following signals, parameters and constants are used by the circuit:

Signal x[n] is the input signal after the A/D converter.

Signal y[n] is the input signal x[n] multiplied by gain "g".

"g" is the programmable amplifier gain.

$\mu$ is the step size used by the DD-LMS adaptive algorithm.

Cref is a constant to be compared to the correlator output C to determine whether to increase or decrease gain "g".

CLK is the sampling clock whose frequency is 1/T (T being the symbol rate)

A is the transmitted AMI pulse's amplitude.

C is the correlator output, to be compared to Cref.

N is the correlator length, equal to the channel impulse response maximum expected length.

P is the number of iterations used to calculate the correlator output.

The circuit in FIG. 2 approximates the calculation of equation (4), using the following discrete equation (8):

$$C = -\frac{4}{A^2} \cdot \sum_{m=1}^{N} m \cdot \sum_{i=0}^{P-1} y[n-i] \cdot y[n-m-i] \quad (8)$$

The digitized signal x[n] is amplified in the amplifier 104 by the gain g. The amplified signal y[n] is provided to a series of N latches 204-208. Each latch delays the signal by an additional cycle. In the exemplary embodiment, each of the latches 204-208 is a D-type flip-flop, but other known types of latches may be used.

The outputs of each latch (y[n-1], y[n-2], ..., y[n-N]) are multiplied by the amplified signal y[n] in a respective multiplier 210-213.

The outputs of each multiplier 210-213 are provided to respective accumulators 280-283. Each accumulator 280-283 corresponds to a different value of the index m, where m varies from 1 to N. Each accumulator 280-283 includes a respective adder 220-223 and a respective latch 230-233. In the exemplary embodiment, each of the latches 230-233 is a D-type flip-flop, but other known types of latches may be used. Each accumulator performs the rightmost (inner) summation of equation (8).

The outputs of the accumulators 281-283 are provided to a respective multipliers 241-243, where they are multiplied by the respective value of the index m for each accumulator. No multiplier is needed for the output of accumulator 280, because the corresponding value of the index m is "1".

The outputs of accumulator 280 and multipliers 241-243 are provided to an adder 250. Adder 250 performs the left (outer) summation of equation (8).

The output of adder 250 is provided to multiplier 260, where it is multiplied by the constant $-4/A^2$. The output of multiplier 260 is the value of C in equation (8). This value is provided to a comparator circuit 270, along with the constant Cref.

The correlator output C is compared to a constant Cref in comparator circuit 270. The value of Cref must meet certain requirements in order to avoid convergence problems. A value that has shown effectiveness is provided by equation (9):

$$Cref = \frac{2}{3} \cdot P \cdot \sqrt{N} \quad (9)$$

In order to allow convergence, the step size $\mu$ for the DD-LMS adaptive algorithm (used by adaptation block 110 to calculate equation (2)) needs to be small enough. A possible value is given by equation (10):

$$\mu = \frac{Cref}{20 \cdot A^2 \cdot (Cref \cdot N - P \cdot \sqrt{N})} \quad (10)$$

Gain "g" is initialized at a certain value. Then P signal samples are used to calculate the first correlator output C. If C is greater than Cref, g is decreased. If C is smaller than Cref, g is increased. P new signal samples are used to calculate the correlator output again, to be compared to Cref. Gain g is updated again. The process is repeated several times until the value of C is close to Cref, within a predetermined convergence criterion.

One of ordinary skill in the art can readily design a suitable comparator block 270. For example, the values C and Cref may be provided to a subtractor, and a proportional-integral-differential (PID) control algorithm may be applied to the difference output of the subtractor. The PID control algorithm increases or decreases g, till C and Cref are sufficiently close to satisfy the convergence criterion. Other algorithms, such as proportional control, proportional-integral (PI) or proportional-differential (PD), may be used.

Other algorithms for reducing the difference between C and Cref may be used, including both linear and non-linear algorithms. For example, if the g variable is just increased/decreased in one least significant bit when C is smaller/bigger than Cref then the algorithm will converge. This algorithm is an example of a non-linear algorithm. Alternatively, the well known half-interval method may be used. Any other converging algorithm may be used.

Once g is updated, a convergence test is applied in block 270. The convergence criterion may be satisfied if: $|C-Cref|<\epsilon$, wherein $\epsilon$ is a convergence threshold, and $|\,\,|$ is the absolute value function. This uses an absolute number as a convergence threshold. Alternatively the convergence criterion may be satisfied if $$\left|\frac{C}{Cref}-1\right|<\varepsilon,$$

wherein $\epsilon$ is a convergence threshold. This variation defines convergence being satisfied when C and Cref are within a predetermined percentage of each other. Although the convergence determination is performed in block 270 in the exemplary embodiment, the convergence determination may also be performed in a separate circuit or block.

When C and Cref are sufficiently close to satisfy the convergence criterion, gain "g" is fixed, and the FIR filter 108 can start filtering the signal y[n] with a central spike coefficient initialization (all coefficients equal to zero except for the central coefficient, equal to one), and the coefficients $w_k$ of filter 108 are adapted using the step size $\mu$.

The present invention provides an improvement over the prior art by means of a method based on the AMI properties, avoiding convergence to the zero ("trivial") solution without instability problems. This method works for any transmission channel assuring correct performance due to the accurate initialization of equalizer 100.

An important advantage of this invention is that it has a perfect control of the equalizer initialization, so convergence to the solution where all coefficients are zero is avoided. The easy implementation of the correlator, whose delay chain can be shared by the FIR filter delay chain, makes this invention very attractive in order to reduce hard-ware complexity compared to other solutions, while ensuring right equalizer performance.

Although the invention has been described in terms of exemplary embodiments, it is not limited thereto. Rather, the appended claim should be construed broadly, to include other variants and embodiments of the invention, which may be made by those skilled in the art without departing from the scope and range of equivalents of the invention.

What is claimed is:

1. A method for processing an input signal, comprising the steps of:

(a) applying a gain to an input signal to form an amplified signal;

(b) calculating an autocorrelation value of the amplified signal;

(c) comparing the autocorrelation value to a predetermined constant;

(d) adjusting the gain, based on which of the group consisting of the autocorrelation value and the predetermined constant is greater; and (e) filtering the amplified signal after step (d).

2. The method of claim 1, further comprising, before step (e), the step of:

repeating steps (a) through (d), until the autocorrelation value is sufficiently close to the predetermined constant to satisfy a convergence criterion.

3. The method of claim 2, wherein the convergence criterion is satisfied if:

$$|C-Cref|<\epsilon,$$

wherein C is the autocorrelation value, Cref is the predetermined constant, and $\epsilon$ is a convergence threshold.

4. The method of claim 2, wherein the convergence criterion is satisfied if:

$$\left|\frac{C}{Cref}-1\right|<\varepsilon,$$

wherein C is the autocorrelation value, Cref is the predetermined constant, and $\epsilon$ is a convergence threshold.

5. The method of claim 1, wherein step (b) includes calculating the autocorrelation value by the equation:

$$C = -\frac{4}{A^2} \cdot \sum_{m=1}^{N} m \cdot \sum_{i=0}^{P-1} y[n-i] \cdot y[n-m-i],$$

wherein C is the autocorrelation value, A is an amplitude of the input signal, y is the amplified signal, and m, n and i are indices.

6. The method of claim 1, wherein the step (c) includes calculating the predetermined constant by the equation:

$$Cref = \frac{2}{3} \cdot P \cdot \sqrt{N},$$

wherein Cref is the predetermined constant, P is a number of iterations used to calculate the autocorrelation value, and N is a length of a filter in which step (e) is performed.

7. The method of claim 1, wherein step (d) includes increasing the gain if the autocorrelation value is smaller than the predetermined constant.

8. The method of claim 1, wherein step (d) includes decreasing the gain if the autocorrelation value is greater than the predetermined constant.

9. The method of claim 1, wherein the filtering step is performed using a finite impulse response filter.

10. The method of claim 9, wherein the filter has a plurality of filter coefficients, further comprising the step of initializing the filter with a single filter coefficient value set to one, and all other filter coefficients set to zero, before step (e) is executed a first time.

11. The method of claim 10, further comprising the step of adapting the filter coefficients using the equation:

$$w_k[n+1]=w_k[n]-\mu \cdot (z[n]-\theta(z[n]))$$

wherein $w_k[n]$ is a value of coefficient number k at iteration number n, $\mu$ is a step size, $z[n]$ is the filtered signal at iteration n, and $\theta(z[n])$ is defined by the equation:

$$\theta(z[n]) = \begin{cases} -A & \text{for } z[n] < -\frac{A}{2} \\ 0 & \text{for } -\frac{A}{2} < z[n] < \frac{A}{2}, \\ A & \text{for } z[n] > \frac{A}{2} \end{cases}$$

wherein A is the amplitude of the input signal.

12. The method of claim 11, wherein step (b) includes calculating the step size $\mu$ by the equation:

$$\mu = \frac{Cref}{20 \cdot A^2 \cdot (Cref \cdot N - P \cdot \sqrt{N})}.$$

13. An equalizer, comprising:
an analog-to-digital converter that receives an analog signal and provides a digital signal;
an amplifier that amplifies the digital signal and outputs an amplified signal, the amplifier having a gain;
a first circuit that calculates an autocorrelation value of the amplified signal;
a comparator that compares the autocorrelation value to a predetermined constant;
a second circuit that adjusts the gain of the amplifier, based on which of the group consisting of the autocorrelation value and the predetermined constant is greater; and
a filter that filters the amplified signal.

14. The equalizer of claim 13, wherein the first circuit calculates the autocorrelation value by the equation:

$$C = -\frac{4}{A^2} \cdot \sum_{m=1}^{N} m \cdot \sum_{i=0}^{P-1} y[n-i] \cdot y[n-m-i],$$

wherein C is the autocorrelation value, A is an amplitude of the input signal, y is the amplified signal, and m, n and i are indices.

15. The equalizer of claim 14, wherein the first circuit calculates a step size $\mu$ of the index m by the equation:

$$\mu = \frac{Cref}{20 \cdot A^2 \cdot (Cref \cdot N - P \cdot \sqrt{N})},$$

wherein the step size $\mu$ is used by a Decision-Directed Least Mean Squares adaptive algorithm to update coefficients of the filter.

16. The equalizer of claim 13, wherein the predetermined constant is determined by the equation:

$$Cref = \frac{2}{3} \cdot P \cdot \sqrt{N},$$

wherein Cref is the predetermined constant, P is a number of iterations used to calculate the autocorrelation value, and N is a length of a filter in which step (f) is performed.

17. The equalizer of claim 13, wherein the second circuit includes means for increasing the gain if the autocorrelation value is smaller than the predetermined constant.

18. The equalizer of claim 13, wherein the second circuit includes means for decreasing the gain if the autocorrelation value is greater than the predetermined constant.

19. The equalizer of claim 13, wherein the convergence criterion is satisfied if:

$$|C - Cref| < \epsilon,$$

wherein C is the autocorrelation value, Cref is the predetermined constant, and $\epsilon$ is a convergence threshold.

20. The equalizer of claim 13, wherein the convergence criterion is satisfied if:

$$\left|\frac{C}{Cref} - 1\right| < \varepsilon,$$

wherein C is the autocorrelation value, Cref is the predetermined constant, and $\epsilon$ is a convergence threshold.

21. The equalizer of claim 13, wherein the filter is a finite impulse response filter.

22. The equalizer of claim 21, wherein the filter has a plurality of filter coefficients, the filter has an initial state in which a single filter coefficient value set to one, and all other filter coefficients set to zero.

23. The equalizer of claim 13, wherein the first circuit includes:
a plurality of latches for providing a plurality of delayed amplified signals;
a first plurality of multipliers, each of the first plurality of multipliers multiplying the equalizer output signal with a respective one of the delayed equalizer output signals to form a product signal;
a plurality of accumulators, each accumulating values of a respective product signal to form a respective sum;
a second plurality of multipliers, each of the second plurality of multipliers applying a respective weight to a respective one of the sums, to form a plurality of weighted sums; and
an adder for adding the weighted sums.

24. An equalizer, comprising:
an analog-to-digital converter that receives an analog signal and provides a digital signal;
an amplifier that amplifies the digital signal and outputs an amplified signal, the amplifier having a gain;
means for calculating an autocorrelation value of the amplified signal;
a comparator that compares the autocorrelation value to a predetermined constant;
means for adjusting the gain of the amplifier, based on which of the group consisting of the autocorrelation value and the predetermined constant is greater; and
a filter that filters the amplified signal.

* * * * *